United States Patent
Basu et al.

(10) Patent No.: US 10,811,250 B2
(45) Date of Patent: Oct. 20, 2020

(54) SILICON NITRIDE FILMS WITH HIGH NITROGEN CONTENT

(71) Applicant: Applied Materials, Inc., Santa Clara, CA (US)

(72) Inventors: Atashi Basu, Menlo Park, CA (US); Srinivas D. Nemani, Sunnyvale, CA (US); Ellie Y. Yieh, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 98 days.

(21) Appl. No.: 16/027,783

(22) Filed: Jul. 5, 2018

(65) Prior Publication Data

US 2019/0013197 A1    Jan. 10, 2019

Related U.S. Application Data

(60) Provisional application No. 62/528,937, filed on Jul. 5, 2017.

(51) Int. Cl.
| | |
|---|---|
| *C23C 16/34* | (2006.01) |
| *H01L 21/02* | (2006.01) |
| *C23C 16/452* | (2006.01) |
| *C23C 16/56* | (2006.01) |
| *C23C 16/505* | (2006.01) |
| *C23C 16/04* | (2006.01) |
| *C23C 16/455* | (2006.01) |

(52) U.S. Cl.
CPC ...... *H01L 21/02219* (2013.01); *C23C 16/045* (2013.01); *C23C 16/345* (2013.01); *C23C 16/452* (2013.01); *C23C 16/45523* (2013.01); *C23C 16/505* (2013.01); *C23C 16/56* (2013.01); *H01L 21/0217* (2013.01); *H01L 21/02274* (2013.01)

(58) Field of Classification Search
None
See application file for complete search history.

(56) References Cited

U.S. PATENT DOCUMENTS

| | | |
|---|---|---|
| 4,863,755 A | 9/1989 | Hess et al. |
| 2014/0051264 A1 | 2/2014 | Mallick et al. |
| 2015/0147871 A1* | 5/2015 | Xiao ............... H01L 21/02126 438/482 |
| 2017/0114465 A1 | 4/2017 | Kalutarage et al. |
| 2017/0335449 A1* | 11/2017 | Li ........................ C23C 16/345 |

FOREIGN PATENT DOCUMENTS

| | | |
|---|---|---|
| WO | 2011010650 A1 | 1/2011 |
| WO | 2016065219 A1 | 4/2016 |
| WO | WO-2016065219 A1 * | 4/2016 ............. C23C 16/36 |

OTHER PUBLICATIONS

Fracassi, F. , et al., Abstract of "Plasma Deposition of Silicon Nitride-Like Thin Films from Organosilicon Precursors", Plasmas and Polymers, vol. 1, No. 1, 1996, 7 pages.

* cited by examiner

*Primary Examiner* — David P Turocy
(74) *Attorney, Agent, or Firm* — Servilla Whitney LLC

(57) ABSTRACT

Methods for depositing silicon nitride films with higher nitrogen content are described. Certain methods comprise exposing a substrate to a silicon-nitrogen precursor and ammonia plasma to form a flowable polymer, and then curing the polymer to form a silicon nitride film. Certain methods cure the flowable polymer without the use of a UV-cure process. Also described is the film generated by the methods described above.

13 Claims, 1 Drawing Sheet

SILICON NITRIDE FILMS WITH HIGH NITROGEN CONTENT

CROSS-REFERENCE TO RELATED APPLICATIONS

This application claims priority to U.S. Provisional Application No. 62/528,937, filed Jul. 5, 2017, the entire disclosure of which is hereby incorporated by reference herein.

TECHNICAL FIELD

The present disclosure relates generally to methods of depositing thin films. In particular, the disclosure relates to processes for depositing silicon nitride films with high nitrogen content.

BACKGROUND

Deposition of thin films on a substrate surface is an important process in a variety of industries including semiconductor processing, diffusion barrier coatings and dielectrics for magnetic read/write heads. In the semiconductor industry, in particular, miniaturization benefits from a high level control of thin film deposition to produce conformal coatings on high aspect structures. One method for deposition of thin films with relative control and conformal deposition is chemical vapor deposition (CVD). CVD involves exposing a substrate (e.g., a wafer) to one or more precursors, which react to deposit a film onto the substrate. Flowable chemical vapor deposition (FCVD) is a type of CVD that allows for the deposition of flowable films, in particular for gap fill applications.

SiN flowable films are commonly utilized for gap fill applications. Currently, such films are generated by trisilylamine (TSA) with radical forms of $NH_3$ as co-reactants. The as-deposited films obtained from the TSA process comprise Si and N as major components. These films usually have nitrogen to silicon ratios in the rage of 0.4:1 to 0.7:1. Films with higher nitrogen content may be useful in patterning applications to solve etch selectivity problems.

Therefore, there is a need for new deposition chemistries that allow the deposition of SiN films with higher nitrogen content.

SUMMARY

One or more embodiments of the disclosure are directed to a method of depositing a SiN film. The method comprises exposing a substrate to a silicon-nitrogen precursor and a $NH_3$ plasma to deposit a flowable SiN polymer, and curing the flowable SiN polymer to form a cured SiN film. In these embodiments, the silicon-nitrogen precursor comprises one or more of:

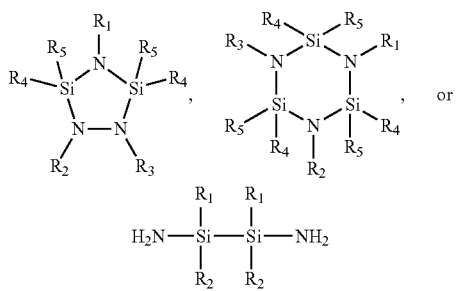

where $R_1$-$R_5$ are independently H or C1-C4 alkyl.

Additional embodiments of the disclosure are directed to a method of depositing a SiN film. The method comprises exposing a substrate maintained at less than or equal to 25° C. to a silicon-nitrogen precursor and an $NH_3$ plasma to deposit a flowable SiN polymer, and curing the flowable SiN polymer to form a cured SiN film, where a ratio of nitrogen to silicon atoms in the cured SiN film is greater than about 1.0. In these embodiments, the silicon-nitrogen precursor comprises one or more of:

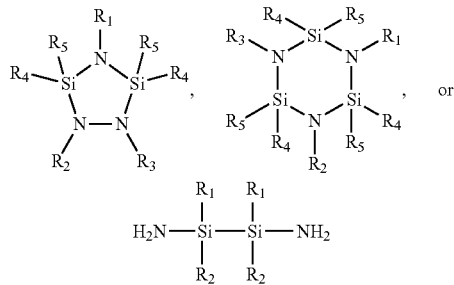

where $R_1$-$R_5$ are independently H or methyl (—CH3), with the proviso that at least one of $R_1$-$R_5$ is methyl.

Further embodiments of the disclosure are directed to a cured SiN film formed by exposing a substrate to a silicon-nitrogen precursor and an $NH_3$ plasma at a temperature less than or equal to about 65° C. without a UV light cure. In these embodiments, a ratio of nitrogen to silicon atoms in the cured SiN film is in the range of about 1.0 to about 1.5 and the silicon nitrogen precursor comprises one or more of:

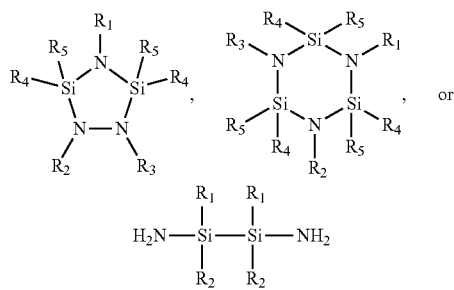

where $R_1$-$R_5$ are independently H or C1-C4 alkyl.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

DETAILED DESCRIPTION

Figure 1:
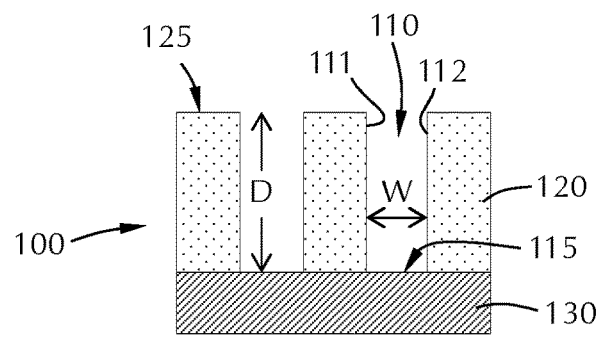
FIG. 1 shows a cross-sectional schematic of a substrate in accordance with one or more embodiment of the disclosure.

Before describing several exemplary embodiments of the invention, it is to be understood that the invention is not limited to the details of construction or process steps set forth in the following description. The invention is capable of other embodiments and of being practiced or being carried out in various ways.

As used in this specification and the appended claims, the term "substrate" refers to a surface, or portion of a surface, upon which a process acts. It will also be understood by those skilled in the art that reference to a substrate can also refer to only a portion of the substrate, unless the context clearly indicates otherwise. Additionally, reference to depositing on a substrate can mean both a bare substrate and a substrate with one or more films or features deposited or formed thereon A "substrate" as used herein, refers to any substrate or material surface formed on a substrate upon which film processing is performed during a fabrication process. For example, a substrate surface on which processing can be performed include materials such as silicon, silicon oxide, strained silicon, silicon on insulator (SOI), carbon doped silicon oxides, amorphous silicon, doped silicon, germanium, gallium arsenide, glass, sapphire, and any other materials such as metals, metal nitrides, metal alloys, and other conductive materials, depending on the application. Substrates include, without limitation, semiconductor wafers. Substrates may be exposed to a pretreatment process to polish, etch, reduce, oxidize, hydroxylate, anneal, UV cure, e-beam cure and/or bake the substrate surface. In addition to film processing directly on the surface of the substrate itself, in the present invention, any of the film processing steps disclosed may also be performed on an underlayer formed on the substrate as disclosed in more detail below, and the term "substrate surface" is intended to include such underlayer as the context indicates. Thus for example, where a film/layer or partial film/layer has been deposited onto a substrate surface, the exposed surface of the newly deposited film/layer becomes the substrate surface.

One or more embodiments of the disclosure are directed to methods of depositing a silicon nitride film through the use of novel silicon-nitrogen precursors. Embodiments of this disclosure utilize a variety of CVD processes. In some embodiments, a plasma-enhanced CVD (PECVD) process is used. A PECVD process is similar to CVD processes commonly known in the art with one or more reactants supplied as a plasma. Without being bound by theory, a PECVD process makes use of radicals present in the plasma reactant to facilitate reactions which would be otherwise unavailable through conventional thermal reactions. In some embodiments, a flowable CVD (FCVD) process is used. An FCVD process is similar to CVD processes commonly known in the art except that the deposited material is "flowable" such that it moves along the surface of the substrate to fill substrate features. The flowable materials deposited in an FCVD process are typically cured to solidify the flowable materials into a cured film which is no longer capable of moving along the substrate surface.

In some embodiments, the film deposition process comprises exposing a substrate to a silicon-nitrogen precursor and $NH_3$ plasma to deposit a flowable SiN polymer. The flowable polymer is cured to form a cured SiN film.

FIG. 1 shows a cross-sectional view of a substrate 100 with two features 110 (e.g. trenches or vias). The number of features in the Figures is merely for illustrative purposes and should not be taken as limiting the scope of the disclosure. Those skilled in the art will understand that there can be no features or any number of features. The shape of the feature 110 can be any suitable shape including, but not limited to, trenches and cylindrical vias. As used in this regard, the term "feature" means any intentional surface irregularity having an aspect ratio greater than or equal to about 2:1. The aspect ratio of a feature is the ratio of the depth D of the feature relative to the width W of the feature. A higher aspect ratio feature will have a narrower/longer shape than a lower aspect ratio feature. In some embodiments, the features have an aspect ratio greater than or equal to about 3:1, 4:1, 5:1, 6:1, 7:1, 8:1, 9:1, 10:1, 15:1, 20:1, 25:1 or 30:1. For purposes of this disclosure, trenches have a top, two sidewalls extending down from a surface to a bottom. As illustrated, each sidewall can be substantially orthogonal to the bottom or can be slanted relative to bottom at an angle other than 90 degrees, so that the opening at the surface is greater than at lower portion of the feature.

Referring to FIG. 1, the substrate 100 may be comprised of two materials; a first material 120 and a second material 130. In some embodiments, the first material 120 and the second material 130 are the same material so that the feature 110 is bounded on the sides and bottom by the same material. In some embodiments, the first material 120 and the second material 130 are different so that the bottom 115 of the feature is a different material than the sidewalls 111, 112 of the feature 110.

The feature 110 extends into the substrate 100 a distance D from the substrate surface 125 to a bottom 115. The feature 110 has a first sidewall 111 and a second sidewall 112 that define a width W of the feature 110. The open area formed by the sidewalls and bottom are also referred to as a gap. Materials which fill the gap are referred to as gapfill.

Figure 2A:
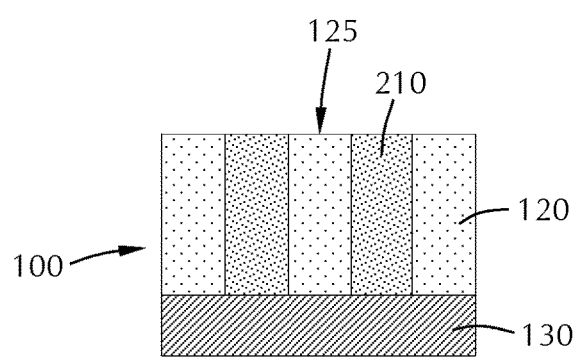
FIG. 2A shows the deposition of a flowable film in accordance with one or more embodiments of the disclosure.
Figure 2B:
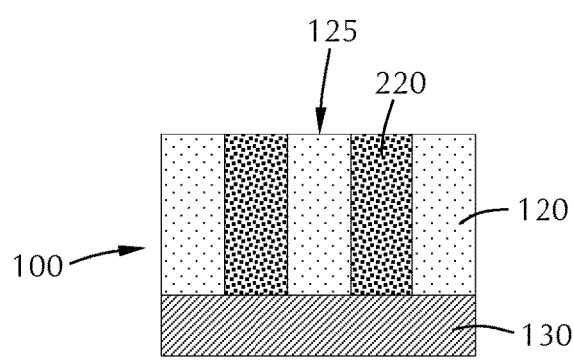
FIG. 2B shows the formation of a cured film in accordance with one or more embodiment of the disclosure.

Referring to FIGS. 2A and 2B, one or more embodiments of the disclosure are directed to film deposition processes that utilize a silicon-nitrogen precursor and a plasma (e.g., ammonia). In some embodiments, the silicon-nitrogen precursor and plasma reactants are flowed simultaneously into the processing chamber. The silicon-nitrogen precursor and plasma can be mixed in the processing chamber or before entering the processing chamber. In some embodiments, these reactants are flowed sequentially into the processing chamber to avoid gas phase mixing of the precursor and plasma reactants.

In some embodiments, the silicon-nitrogen precursor comprises a compound having the general formula (I)

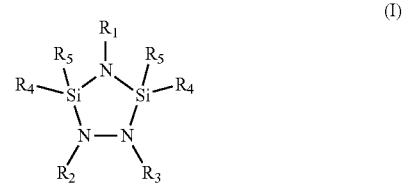

where each of the R substituents ($R_1$-$R_5$) is independently selected from H or C1-C4 alkyl. For the purposes of this disclosure, C1-C4 alkyl means any group with 1-4 carbon atoms. Examples of C1-C4 alkyl groups include, but are not limited to, methyl, ethyl, propyl, isopropyl, butyl, isobutyl, sec-butyl and t-butyl groups. In some embodiments, all of the R groups are the same. In some embodiments, at least one of the R substituents is a methyl group. In some embodiments, at least one of the R groups is not a hydrogen atom. In some embodiments, at least one of the R groups comprises an ethyl group, a propyl group, an isopropyl group, a butyl group, an isobutyl group, a sec-butyl group or a t-butyl group.

In some embodiments, the silicon-nitrogen precursor consists essentially of a compound of Formula (I) where each $R_1$-$R_5$ are independently H or C1-C4 alkyl. As used in this regard, the term "consists essentially of" means that the reactive species in the silicon-nitrogen precursor is greater than or equal to about 95% of the designated species, on a molar basis. In some embodiments, the silicon-nitrogen precursor comprises one or more of:

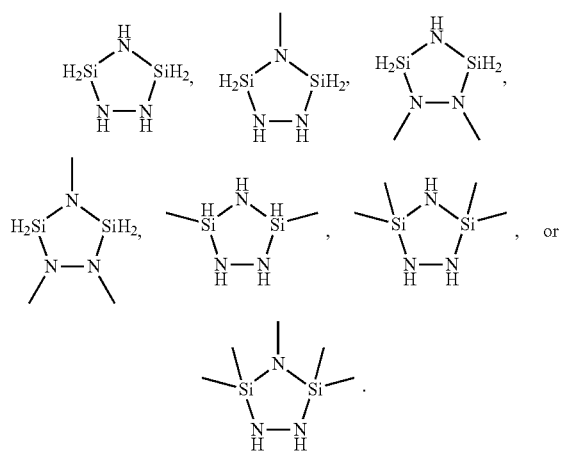

In some embodiments, the silicon-nitrogen precursor comprises a compound having the general formula (II)

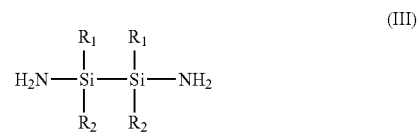

where each of the R substituents ($R_1$-$R_5$) is independently selected from H or C1-C4 alkyl. Examples of C1-C4 alkyl groups include, but are not limited to, methyl, ethyl, propyl, isopropyl, butyl, isobutyl, sec-butyl and t-butyl groups. In some embodiments, all of the R groups are the same. In some embodiments, at least one of the R substituents is a methyl group. In some embodiments, at least one of the R groups is not a hydrogen atom. In some embodiments, at least one of the R groups comprises an ethyl group, a propyl group, an isopropyl group, a butyl group, an isobutyl group, a sec-butyl group or a t-butyl group.

In some embodiments, the silicon-nitrogen precursor consists essentially of a compound of Formula (II) where each $R_1$-$R_5$ are independently H or C1-C4 alkyl. In some embodiments, the silicon-nitrogen precursor comprises one or more of:

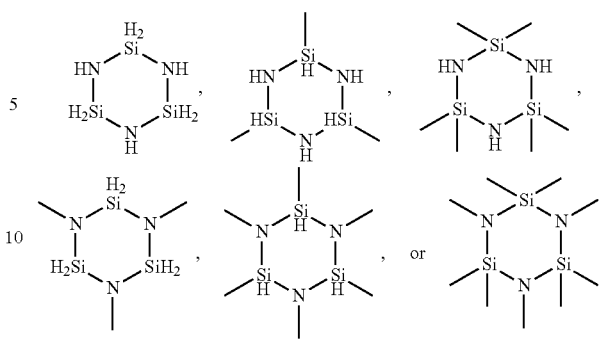

In some embodiments, the silicon-nitrogen precursor comprises a compound having the general formula (III)

$$H_2N-\underset{\underset{R_2}{|}}{\overset{\overset{R_1}{|}}{Si}}-\underset{\underset{R_2}{|}}{\overset{\overset{R_1}{|}}{Si}}-NH_2 \qquad (III)$$

where each of the R substituents ($R_1$-$R_2$) is independently selected from H or C1-C4 alkyl. Examples of C1-C4 alkyl groups include, but are not limited to, methyl, ethyl, propyl, isopropyl, butyl, isobutyl, sec-butyl and t-butyl groups. In some embodiments, all of the R groups are the same. In some embodiments, at least one of the R substituents is a methyl group. In some embodiments, at least one of the R groups is not a hydrogen atom. In some embodiments, at least one of the R groups comprises an ethyl group, a propyl group, an isopropyl group, a butyl group, an isobutyl group, a sec-butyl group or a t-butyl group.

In some embodiments, the silicon nitrogen precursor consists essentially of a compound of Formula (III) where $R_1$-$R_2$ are independently H or C1-C4 alkyl. In some embodiments, the silicon-nitrogen precursor comprises one or more of:

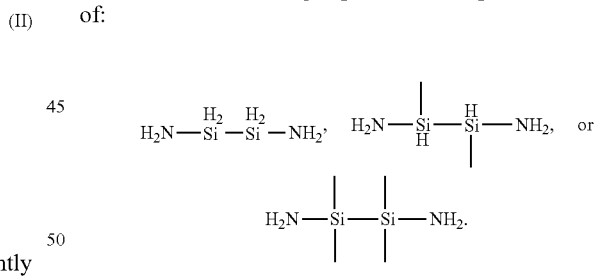

The silicon-nitrogen precursor may be provided in one or more pulses or continuously. The flow rate of the precursor can be any suitable flow rate including, but not limited to, flow rates is in the range of about 1 to about 1000 sccm, or in the range of about 2 to about 500 sccm, or in the range of about 3 to about 200 sccm or in the range of about 5 to about 100 sccm or in the range of about 10 to about 50 sccm or in the range of about 15 to 25 sccm. In some embodiments, the flow rate of the precursor is less than or equal to about 50 sccm, 45 sccm, 40 sccm, 35 sccm, 30 sccm, 25 sccm, 20 sccm or 15 sccm. The precursor can be provided at any suitable pressure including, but not limited to, a pressure in the range of about 5 mTorr to about 25 Torr, or in the range of about 100 mTorr to about 20 Torr, or in the range of about 5 Torr to about 20 Torr, or in the range of about 50 mTorr to about 2000 mTorr, or in the range of about 100 mTorr to about 1000 mTorr, or in the range of about 200 mTorr to about 500 mTorr.

A "pulse" or "dose" as used herein is intended to refer to a quantity of a reactant that is intermittently or non-continuously introduced into the process chamber. The quantity of a particular compound within each pulse may vary over time, depending on the duration of the pulse. Any particular reactant may include a single compound or a mixture/combination of two or more compounds.

The durations for each pulse/dose are variable and may be adjusted to accommodate, for example, the volume capacity of the processing chamber as well as the capabilities of a vacuum system coupled thereto. Additionally, the dose time of a reactant may vary according to the flow rate of the reactant, the temperature of the reactant, the type of control valve, the type of process chamber employed, as well as the ability of the components of the reactant to react and form a suitable film. Dose times may also vary based upon the type of film being formed and the geometry of the substrate. A dose time should be long enough to provide a volume of reactant sufficient to adsorb/chemisorb onto substantially the entire surface of the substrate and form a layer of reactive species thereon.

In some embodiments, the reactant comprises an inert, diluent and/or carrier gas. The inert, diluent and/or carrier gas may be mixed with the reactive species and can be pulsed or have a constant flow. In some embodiments, the carrier gas is flowed into the processing chamber at a constant flow in the range of about 1 to about 20000 sccm. The carrier gas may be any gas which does not interfere with the film deposition. For example the carrier gas may comprises one or more of argon, helium, hydrogen, nitrogen, neon, or the like, or combinations thereof. In one or more embodiments, the carrier gas is mixed with the reactive species prior to flowing into the process chamber.

The ammonia plasma can be generated at any suitable location. The plasma can be generated or ignited within the processing chamber (e.g., a direct plasma) or can be generated outside of the processing chamber and flowed into the processing chamber (e.g., a remote plasma). In some embodiments, the plasma is generated external from the processing chamber, such as by a remote plasma source. In some embodiments, remote plasma generation can occur upstream of the deposition chamber such that reactive species are in direct contact with the deposited film.

The plasma is described with respect to an ammonia plasma. However, those skilled in the art will understand that the plasma can have different reactive species than ammonia. For example, the plasma can include nitrogen or hydrazine. The ammonia plasma may be generated via any suitable plasma generation process or technique known to those skilled in the art. For example, plasma may be generated by one or more of a microwave (MW) frequency generator or a radio frequency (RF) generator. The frequency of the plasma may be tuned depending on the specific reactive species being used. Suitable frequencies include, but are not limited to, 2 MHz, 13.56 MHz, 40 MHz, 60 MHz and 100 MHz.

In some embodiments, the $NH_3$ plasma is generated using a remote plasma source. In some embodiments, the plasma power is less than or equal to about 300 W. In one or more embodiments, the plasma power is less than or equal to about 250 W, 200 W, 150 W, 100 W, 50 W or 25 W. In some embodiments, the plasma power is in the range of about 10 W to about 200 W, or in the range of about 25 W to about 175 W, or in the range of about 50 W to about 150 W.

In some embodiments, the plasma is generated in a remote plasma source and flowed to the processing region of a processing chamber so that the radicals present in the plasma can react with the silicon-nitrogen precursor or the substrate or film on the substrate. In some embodiments, the remote plasma is configured so that there is a greater number of radicals than ions in the processing region of the processing chamber.

In some embodiments, the $NH_3$ radicals are generated using a hot wire in place of or in addition to the plasma source. As used in this specification and the appended claims, the term "hotwire" means any element that can be heated to a temperature sufficient to generate radicals in a fluid flowing across the element. In some embodiments, the hotwire is one or more metallic filaments (e.g., tungsten). In some embodiments, the hotwire is a filament comprising one or more of tungsten, tantalum or ruthenium. In some embodiments, the filament temperature is maintained in the range of about 200° C. to about 1500° C. or in the range of about 1000° C. to about 1500° C. or in the range of 1100° C. to about 1400° C. In some embodiments, the filament temperature is maintained at a temperature less than about 1500° C., 1400° C., 1300° C. or 1200° C. In embodiments in which a hotwire is employed to generate radical species, the substrate is maintained at a cool temperature (i.e., less than or equal to about 65° C.).

During deposition, the substrate 100 temperature can be controlled. In some embodiments, the substrate 100 is cooled to a temperature less than or equal to about 25° C. Such cooling can be accomplished by any suitable means including, but not limited to, changing the temperature of the substrate support or flowing cooled gases to the substrate surface. In some embodiments, the substrate support includes a chiller which can be controlled to change the substrate temperature conductively. In one or more embodiments, the gases (including reactants and/or carrier gases) being employed are cooled to locally change the substrate temperature. In some embodiments, a chiller is positioned within the chamber adjacent the substrate surface to convectively change the substrate temperature.

Referring to FIG. 2A, the substrate 100 is exposed to the silicon-nitrogen precursor and the reactant to form a flowable film 210 on the substrate. The flowable film 210 illustrated in FIG. 2A is only in the features; however, those skilled in the art will understand that this is merely for descriptive purposes.

The flowable film 210 can be deposited on a substrate maintained at any suitable temperature. In some embodiments, the substrate is maintained at a temperature in the range of about −100° C. to about 65° C., or in the range of about −85 to about 45° C., or in the range of about −75° C. to about 20° C., or in the range of about −50° C. to about 10° C., or in the range of about −25° C. to about 0° C. Without being bound by theory, the temperature is kept low to promote the polymerization of the silicon nitrogen precursors. In some embodiments, the substrate is maintained at a temperature less than about 65° C., 60° C., 55° C., 50° C., 45° C., 40° C., 35° C., 30° C., 25° C., 20° C., 15° C., 10° C., 5° C., 0° C., −10° C., −20° C., −30° C., −40° C., −50° C., −60° C., −70° C., −80° C. or −90° C.

The flowable film 210 can be formed at any suitable pressure. In some embodiments, the pressure used for formation of the flowable film 210 is in the range of about 0.5 T to about 50 T, or in the range of about 0.75 T to about 25 T, or in the range of about 1 T to about 10 T, or in the range of about 2 T to about 8 T, or in the range of about 3 T to about 6 T.

Referring to FIG. 2B, after deposition, the flowable film 210 is cured to form a cured film 220. The flowable film 210 can be cured by any suitable means. In some embodiments, the flowable film 210 is cured by exposure to the radicals within the plasma or from the hotwire. In some embodiments, the flowable film 210 is cured by exposure to ultraviolet (UV) radiation. Stated differently, in some embodiments, UV radiation exposure is used to cure the flowable film 210. This may also be referred to as a UV radiation cure process. In some embodiments, the flowable film 210 is cured without the use of UV radiation. In some embodiments, the flowable film 210 is cured substantially only by radical exposure. As used in this specification and the appended claims, the term "cured substantially only by radical exposure" means that greater than or equal to about 90%, 95%, 98% or 99% of the flowable film 210 is cured using radicals.

In some embodiments, the cured film is subjected to a post-deposition treatment process. In some embodiments, the post-deposition treatment process comprises at least one process to polish, etch, reduce, oxidize, hydroxylate, anneal, UV cure, e-beam cure or bake the substrate surface or any deposited film.

With reference to FIG. 2B, a cured film 220 is formed on the substrate 100. Within the gap, a partial film of gapfill forms along the sidewalls 111, 112 and the bottom 115. As this film forms, the potential exists for the formation of a seam if the top of the gap closes before the bottom is filled with gapfill material. Seam formation is more likely to occur in higher aspect ratio features as the film at the top of the feature tends to pinch close so that a void is enclosed within the deposited gapfill. As used in this regard, the term "seam" means any space or void between the sidewalls 111, 112 where the volume of the void volume is greater than 1% of the volume of the gap or other feature. In some embodiments, the cured SiN film deposited is substantially free of seams.

The cured film of the disclosed embodiments has a higher ratio of nitrogen atoms to silicon atoms. In some embodiments, the cured SiN film has a ratio of nitrogen atoms to silicon atoms of greater than or equal to about 0.7, 0.8, 0.9, or 1.0. In some embodiments, the cured SiN film has a ratio of nitrogen atoms to silicon atoms is in the range with a lower end of about 1.0, 1.1, 1.2 or 1.33 to an upper end of about 1.33, 1.4 or 1.5. In some embodiments, the cured SiN film contains substantially no carbon atoms. As used in this regard, the term "substantially no carbon atoms" means that carbon atoms make up less than or equal to about 5%, 2% or 1% of the atoms in the cured film on an atomic basis.

Reference throughout this specification to "one embodiment," "certain embodiments," "one or more embodiments" or "an embodiment" means that a particular feature, structure, material, or characteristic described in connection with the embodiment is included in at least one embodiment of the disclosure. Thus, the appearances of the phrases such as "in one or more embodiments," "in certain embodiments," "in one embodiment" or "in an embodiment" in various places throughout this specification are not necessarily referring to the same embodiment of the disclosure. Furthermore, the particular features, structures, materials, or characteristics may be combined in any suitable manner in one or more embodiments.

Although the disclosure herein has been described with reference to particular embodiments, those skilled in the art will understand that the embodiments described are merely illustrative of the principles and applications of the present disclosure. It will be apparent to those skilled in the art that various modifications and variations can be made to the method and apparatus of the present disclosure without departing from the spirit and scope of the disclosure. Thus, the present disclosure can include modifications and variations that are within the scope of the appended claims and their equivalents.

What is claimed is:

1. A method of depositing a SiN film, comprising:
exposing a substrate to a silicon-nitrogen precursor and a $NH_3$ plasma to deposit a flowable SiN polymer; and
curing the flowable SiN polymer to form a cured SiN film;
wherein the silicon-nitrogen precursor consists essentially of:

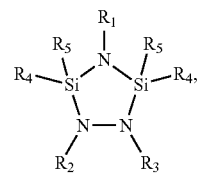

wherein $R_1$-$R_5$ are independently H or C1-C4 alkyl.

2. The method of claim 1, wherein at least one R group in the silicon-nitrogen precursor is a methyl group.

3. The method of claim 1, wherein the silicon-nitrogen precursor comprises one or more of:

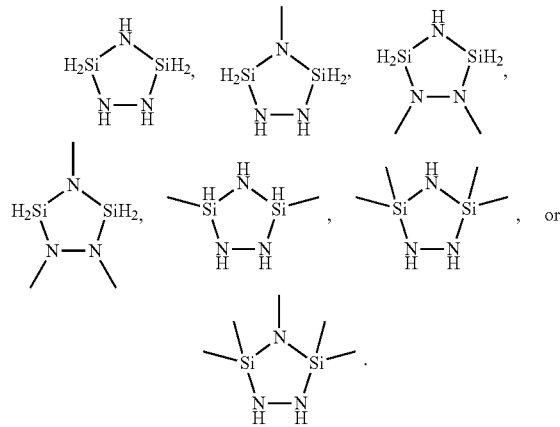

4. The method of claim 1, wherein the plasma is generated using a remote plasma source.

5. The method of claim 1, wherein the flowable SiN polymer is cured by exposure to radicals in the plasma.

6. The method of claim 1, further comprising a post-deposition treatment comprising UV radiation exposure or annealing.

7. The method of claim 1, wherein the cured SiN film has a ratio of nitrogen atoms to silicon atoms of greater than or equal to about 0.7.

8. The method of claim 7, wherein the cured SiN film has a ratio of nitrogen atoms to silicon atoms of greater than or equal to about 1.0.

9. The method of claim 1, wherein the cured SiN film has a ratio of nitrogen atoms to silicon atoms is in the range of about 1.0 to about 1.5.

10. The method of claim 1, wherein the substrate is maintained at a temperature of less than or equal to about 65° C.

11. The method of claim 10, wherein the substrate is maintained at a temperature in the range of about −100° C. to about 65° C.

12. The method of claim 1, wherein the cured SiN film contains substantially no carbon atoms.

13. A method of depositing a SiN film, comprising:
exposing a substrate maintained at less than or equal to 25° C. to a silicon-nitrogen precursor and a $NH_3$ plasma to deposit a flowable SiN polymer; and
curing the flowable SiN polymer to form a cured SiN film;
wherein a ratio of nitrogen to silicon atoms in the cured SiN film is greater than about 1.0 and the silicon-nitrogen precursor consists essentially of:

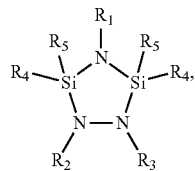

wherein $R_1$-$R_5$ are independently H or $CH_3$, with the proviso that at least one of $R_1$ to $R_5$ is methyl.

* * * * *